US006662441B2

(12) United States Patent
Janecek

(10) Patent No.: US 6,662,441 B2
(45) Date of Patent: Dec. 16, 2003

(54) METHOD FOR MAKING MULTI-LAYER PRINTED CIRCUIT BOARD REGISTRATION

(75) Inventor: Mark L. Janecek, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 09/818,459

(22) Filed: Mar. 27, 2001

(65) Prior Publication Data

US 2001/0030058 A1 Oct. 18, 2001

Related U.S. Application Data

(62) Division of application No. 09/002,606, filed on Jan. 5, 1998, now Pat. No. 6,232,559.

(51) Int. Cl.[7] .............................. H05K 3/02; H05K 3/10
(52) U.S. Cl. ............................ 29/846; 29/830; 29/831; 29/852; 257/797; 361/802
(58) Field of Search .......................... 29/825, 829, 830, 29/832, 833, 846, 849, 852; 174/255, 250; 257/797; 361/792, 802, 803, 804, 784, 795

(56) References Cited

U.S. PATENT DOCUMENTS

| 4,510,446 A | | 4/1985 | Braun et al. ................. 324/766 |
| 5,093,183 A | * | 3/1992 | Strunka ....................... 361/748 |
| 5,111,406 A | | 5/1992 | Zachman et al. ............ 700/160 |
| 5,195,417 A | | 3/1993 | Hancock et al. ............... 83/34 |
| 5,214,571 A | * | 5/1993 | Dahlgren et al. ............ 361/792 |
| 5,214,990 A | | 6/1993 | Ben-David et al. ............. 83/13 |
| 5,266,380 A | * | 11/1993 | Renguso et al. ............. 174/250 |
| 5,347,462 A | | 9/1994 | Okuda et al. ................ 700/192 |
| 5,369,491 A | | 11/1994 | Schneider .................... 356/372 |
| 5,377,404 A | | 1/1995 | Berg ............................. 29/830 |
| 5,429,859 A | * | 7/1995 | Young ......................... 174/250 |
| 5,529,441 A | | 6/1996 | Kosmowski et al. ........ 408/1 R |
| 5,548,372 A | | 8/1996 | Schroeder et al. ............. 355/33 |
| 5,768,107 A | * | 6/1998 | Ouchi et al. ................. 174/255 |
| 6,091,026 A | * | 7/2000 | Yang ........................... 174/250 |
| 6,114,634 A | * | 9/2000 | Dittmer .................... 29/407.01 |

OTHER PUBLICATIONS

"Automatic Method for Registration and Stacking of Laminates", *IBM Technical Disclosure Bulletin*, vol. 33, No. 7, Dec. 1990, pp. 410–414.

* cited by examiner

*Primary Examiner*—Peter Vo
*Assistant Examiner*—Donghai Nguyen
(74) *Attorney, Agent, or Firm*—Arthur J. Samodovitz

(57) ABSTRACT

A method for detecting misalignment of layers of a multi-layer circuit board. A plurality of layers of electrically insulating material are formed. At least one artwork feature is formed on a surface of at least one of the layers of electrically insulating material in the vicinity of at least one edge of the at least one layer of electrically insulating material. At least one reference point is formed on the at least one layer of electrically insulating material. The layers of electrically insulating material are joined together. The at least one artwork feature is exposed by removing a portion of the at least one layer of electrically insulating material. A location of the at least one artwork feature relative to the at least one reference point is visually determined, thereby detecting misalignment of the layers of electrically insulating material.

7 Claims, 2 Drawing Sheets

METHOD FOR MAKING MULTI-LAYER PRINTED CIRCUIT BOARD REGISTRATION

CROSS-REFERENCE TO COPENDING APPLICATION

This application is a divisional application of Ser. No. 09/002,606, filed Jan. 5, 1998, now U.S. Pat. No. 6,232,559.

FIELD OF THE INVENTION

The present invention relates to multi-layer circuit boards and method of forming multi-layer circuit boards. In particular, the present invention relates to methods for forming multi-layer circuit boards and detecting and compensating for misalignment of layers of the multi-layer circuit boards. Additionally, the present invention relates to multi-layer circuit boards formed according to the method.

BACKGROUND OF THE INVENTION

Typically, multi-layer circuit boards are formed from a plurality of layers of various materials. The materials may be electrically insulating or electrically conducting. Typically, the layers are formed and various materials are deposited on the surface of one or more layers and/or various materials are introduced into portions of the various layers. Additionally, various structures, such as holes, may be formed through one or more of the layers. Furthermore, circuitization may be formed on surface(s) of the layers. After forming the layers, the layers may then be assembled into a multi-layer structure.

Often, it is important that it is known where the layers are relative to each other in the multi-layer structure. Also, it may be important to know where structures in and/or on the layers are relative to structures in and/or on other layers in the multi-layer structure. For example, when forming structures such as holes, for example, plated through holes, in the multi-layer structure, it may be important to know where the various layers, and structures formed in and/or on the layers, are relative to each other to ensure that the through holes are located in the correct position and/or an optimal position for functioning of the circuit board.

In the past, alignment, or registration, of layers of multi-layer circuit boards has been achieved through a variety of means. For example, X-rays have been used to detect the placement of various features in and/or on layers of multi-layer circuit boards. Additionally, physical means have been utilized, such as drilling holes in each layer of a multi-layer circuit board and then stacking the circuit boards on a pin. Additionally, indentations have been formed in the sides of circuit board layers to align the layers. Such methods can be costly, inaccurate, and wasteful of materials.

BRIEF SUMMARY OF THE INVENTION

The present invention provides a system for ensuring alignment, or registration, of layers of a multi-layer circuit board without requiring the use of the above-discussed methods.

Accordingly, one advantage of the present invention is that it helps to ensure alignment, or registration, of layers of a multi-layer circuit board without the use of X-rays.

An object of the present invention is to provide a method for ensuring alignment of layers of a multi-layer circuit board.

In accordance with these and other objects and advantages, the present invention provides a method for detecting misalignment of layers of a multi-layer circuit board. A plurality of layers of electrically insulating material are formed. At least one artwork feature is formed on a surface of at least one of the layer of electrically insulating material in the vicinity of at least one edge of the at least one layer of electrically insulating material. At least one reference point is formed on the at least one layer of electrically insulating material. The layers of electrically insulating material are joined together. The at least one artwork feature on the at least one layer of electrically insulating material is/are exposed by removing a portion of the at least one layer of electrically insulating material. A location of the at least one artwork feature relative to the reference points is visually determined, thereby detecting misalignment of the layers of electrically insulating material.

Aspects of the present invention also include a method for forming a multi-layer circuit board. The method includes forming a plurality of layers of an electrically insulating material. At least one artwork feature on a surface of at least one layer of electrically insulating material in the vicinity of at least one edge of the at least one layer of electrically insulating material. The layers of electrically insulating material are joined together. The at least one artwork feature on the at least one layer of electrically insulating material is exposed. A reference point is provided on the at least one layer of electrically insulating material. A location of the at least one artwork feature relative to the reference points is visually determined, thereby detecting misalignment of the layers of electrically insulating material. An optimal location for forming at least one additional feature in or on the multi-layer circuit board is determined based upon the locations of the at least one artwork feature relative to the reference points. The at least one additional feature is formed in or on the multi-layer circuit board.

According to further aspects, the present invention provides a multi-layer circuit board. The circuit board includes a plurality of layers of an electrically insulating material. At least one artwork feature is located on a surface of at least one of the layers of electrically insulating material in the vicinity of at least one edge of each of the at least one layer of electrically insulating material. At least one reference point is located on the at least one layer of electrically insulating material. At least one additional feature is located in or on at least one layer of the multi-layer circuit board.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
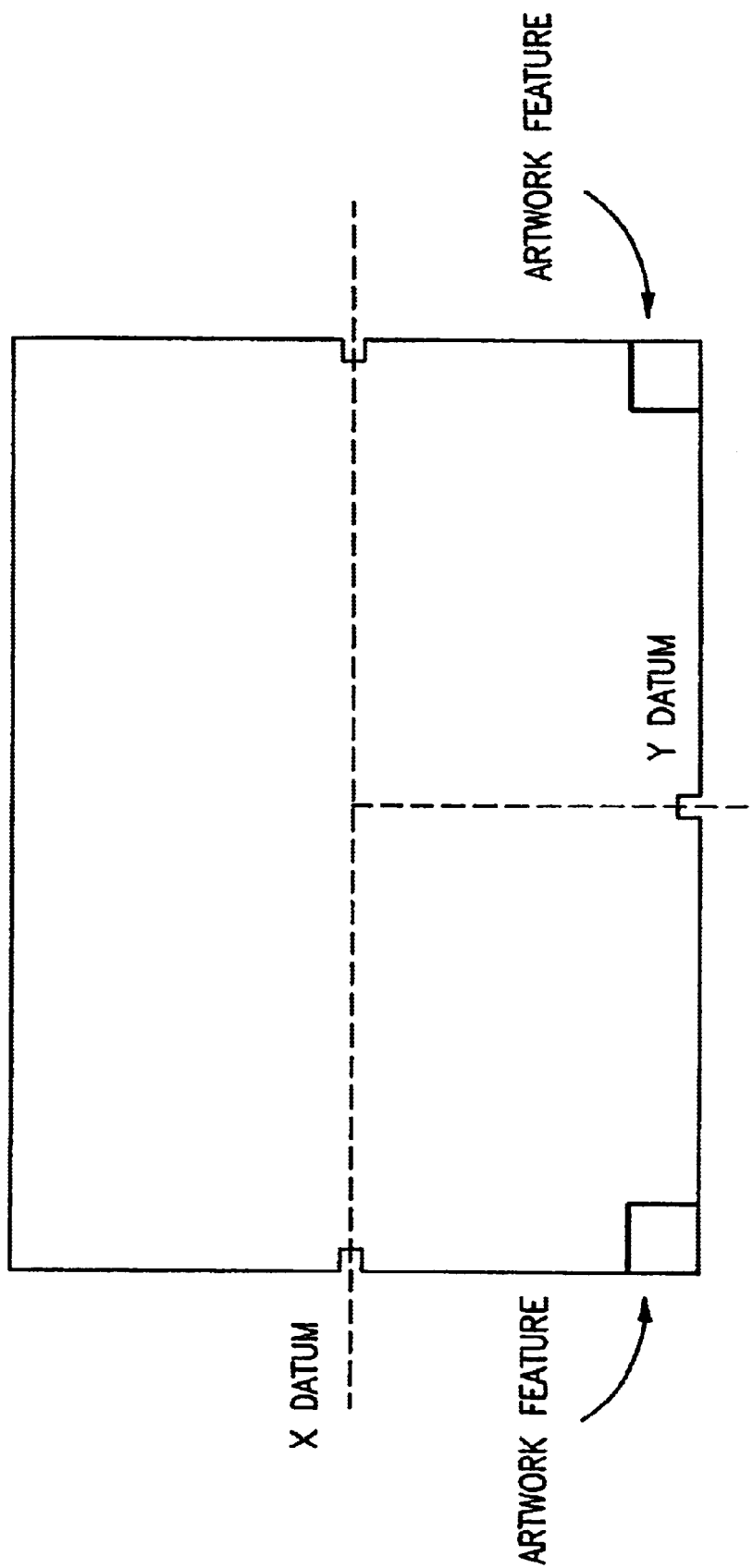
FIG. 1 represents an overhead view of a layer of a multi-layer circuit board showing one embodiment of artwork features that may be provided on the layer and reference points that the location of the artwork feature is relative to is determined.

As discussed above, the present invention provides a method for determining precise alignment of various layers of a multi-layer circuit board. The present invention detects alignment, or misalignment, also known as registration, of layers of a multi-layer circuit board by utilizing a visual system to detect visually discernible targets located in a pattern on exterior exposed edges of layers of the multi-layer circuit board structure. Once the alignment of layers of the multi-layer structure is known, this information may be utilized in optimizing placement of various additional features in and/or on the multi-layer structure. As discussed above, no such visual detection system is known in the art. Some systems may utilize a visual system for detecting alignment, however, such systems typically are arranged over a multi-layer structure and look at the top surface of the structure and possibly into holes in the structure.

According to methods of the present invention, at least one artwork feature is provided on at least one layer of a multi-layer circuit board such that the at least one artwork feature may be visually detected and the alignment of all of the layers determined. "Artwork feature" is meant to refer to a feature or distinguishing marking deposited, formed, or otherwise provided on the surface of one or more layers of a multi-layer circuit board. The at least one artwork feature may be provided on at least one surface of at least one layer of the multi-layer structure during the fabrication of the layers. The layers are then assembled into a multi-layer structure. The alignment, or misalignment, of the layers is determined after assembly of the layers into a multi-layer structure. Of course, any number of artwork features may be provided on any number of layers in the structure. One embodiment includes an artwork feature on each layer.

According to the present invention, layers of electrically insulating material(s) are formed. Typically, layers making up a multi-layer circuit board are rectangular. If desired, circuit, or other features, may be formed in and/or on at least one surface of at least one of the layers of electrically insulating material. The electrically insulating material may be a dielectric. An example of a dielectric is a fluoropolymer. Other examples of such materials are well-known in the art and include polyimides and polyepoxides.

Prior to assembling the layers of electrically insulating material to form a multi-layer structure, at least one artwork feature may be provided on a surface of at least one of the layers of electrically insulating material. Preferably, the artwork feature(s) are optically discernable. Preferably, the artwork feature is visible when viewing a peripheral edge of the multi-layer structure that includes the artwork feature. The edge may need to be trimmed to view the artwork feature(s). Regardless of how the artwork feature(s) is made visible, preferably its location relative to a datum is visible using an optical device, such as a CCD camera. In fact, a plurality of artwork features could be utilized to outline a dielectric feature allowing it to be optically discernable.

Each artwork feature may be made of a variety of materials. Typically, the artwork feature(s) are made of a material that is optically discernable. For example, the artwork feature(s) may be made of a reflective material. Examples of materials that could be used to form the artwork features include copper and chromium.

Alternatively, the artwork feature(s) could be made of at least one phosphorescent material or other material that permits the artwork feature(s) to be discerned. For example, the phosphorescent material or other material could be discerned utilizing an ultraviolet light source. The phosphorescent material or other material may permit the artwork feature(s) to be discerned without the use of reflectivity. Additionally, the phosphorescent material or other material or the other materials described above, such as the reflective materials, could be surrounded by contrasting material that permits the artwork feature(s) to be more readily discerned.

The configuration, such as shape, thickness, and location of the artwork feature(s) may vary. One example of the shape of an artwork feature that may be provided on layers forming a multi-layer structure is shown in FIG. 1. The artwork features shown in FIG. 1 are V-shaped, with the arms of the "V" perpendicular to each other and arranged such that the end of each arm extends to an area in the vicinity of, or substantially at, the edge of the layer of electrically insulating material. The artwork feature may not extend entirely to the edge since the side of the layers making up the multi-layer structure may be trimmed later to ensure exposure of the artwork features.

The configuration, such as shape, thickness, and location of the artwork features may vary. However, preferably, they can be optically detected.

The artwork features may be laid down using known techniques for forming materials on layers of dielectric material. For example, the materials may be deposited. Although the artwork features shown in FIG. 1 are V-shaped, in other embodiments the artwork features may have different shapes. For example, the artwork feature could extend to the same point as shown in FIG. 1 but simply be a straight line between the two points. Preferably, the artwork features extend at least somewhat into an internal portion of the layer.

The number of artwork features included on a layer of a multi-layer structure may vary. Only one artwork feature need be provided on only one layer of a multi-layer structure. However, at least one artwork feature may be provided on a surface of each internal layer making up a multi-layer structure. Alternatively, two artwork features may be provided on at least one layer of a multi-layer structure, such as the embodiment shown in FIG. 1. Preferably, the number, size, location, and shape of artwork features provided are sufficient to permit detection of misalignment of layers after assembly of the layers in both an X and a Y direction.

To assist in detecting the location of the layers relative to each other, and the location of portions of each layer with respect to other portions of the same layer, reference points may be provided on each layer. FIG. 1 shows an example of such reference points. In FIG. 1, an indentation is formed on three sides of the layer shown. The indentation, or datum, preferably is located so as to permit the alignment of one layer with respect to another layer or layers within the multi-layer structure to be determined.

Preferably, the reference points are located in the same location on each layer. This may permit the layers to be stacked so that the reference points are all aligned. Additionally, the indentation or datum preferably is located so as to permit determination of locations within a layer relative to other locations within the same layer.

Preferably, at least one reference point, or locating feature, is provided on at least one of the layers of electrically insulating material. Additionally, the at least one layer preferably is the same layer that the at least one artwork feature is formed on.

According to one embodiment, at least two reference points are provided, one on one side of a layer and one on an adjacent side of the layer to permit detection of alignment in both an X and a Y direction. An artwork feature may be located on the same layer of electrically insulating material so as to be visible from each side that is provided with a datum or reference point. Other examples of reference points, or panel datum, that may be utilized in determining the location of points within and among layers of a multi-layer structure include holes formed at various locations in a layer.

The reference points may be drilled, routed, and/or punched slots, holes, notches, or other opening utilized to mechanically locate a part for processing, such as drilling, circuitization, contact testing, among others. However, the reference points may also be an optically discernable feature such as any of those described above for the artwork feature(s), not requiring mechanical locating. New reference points need not be created for the present invention. Registration or mis-registration data can be collected according to the present invention. New registration features can be formed or the data utilized in subsequent processing.

Additional layers of a multi-layer structure, artwork features, and reference points may be formed in the same manner as described above.

Either prior to, or after, assembly of multiple layers into the multi-layer circuit board, edges of the layers may be trimmed so as to ensure that the artwork feature(s) may be visually detected when looking at the side of the layer or the assembled multi-layer structure.

Once the artwork feature(s), any circuit features and reference points are formed, layers may be assembled into a multi-layer structure. Preferably, the artwork features on each layer are located in a similar position so as to enable the detection of alignment or misalignment of layers or portions thereof. The artwork features may then be exposed.

Figure 2:
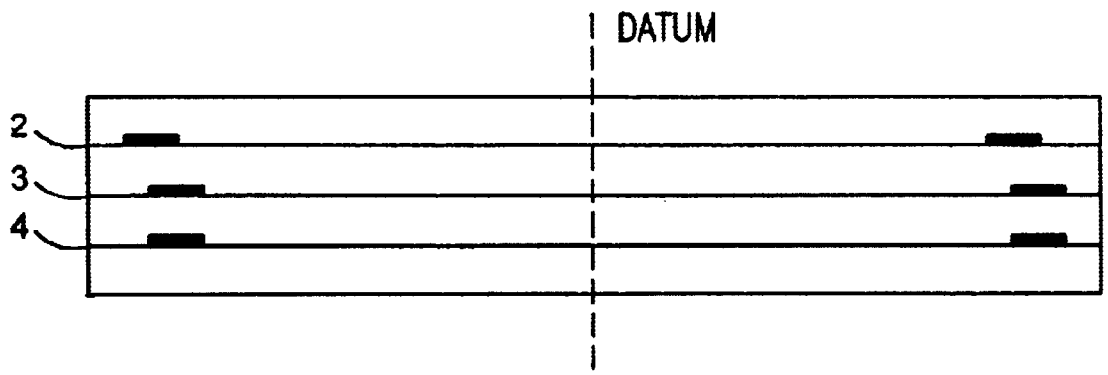
FIG. 2 represents a cross-sectional view of the multi-layer circuit board showing artwork features that have been exposed.

FIG. 2 shows an example of an embodiment of a five layer circuit board showing exposed artwork features according to the present invention. As can be seen in FIG. 2, the present invention does not require including artwork features on every layer of a multi-layer structure. For example, the top and bottom layers of the structure shown in FIG. 2 do not include artwork features.

As discussed above, after assembly of the layers into a multi-layer structure, the location of the artwork features relative to each other and/or the reference points may be determined. The alignment or misalignment of all of the layers of the multi-layer structure may then be determined.

Figure 3:
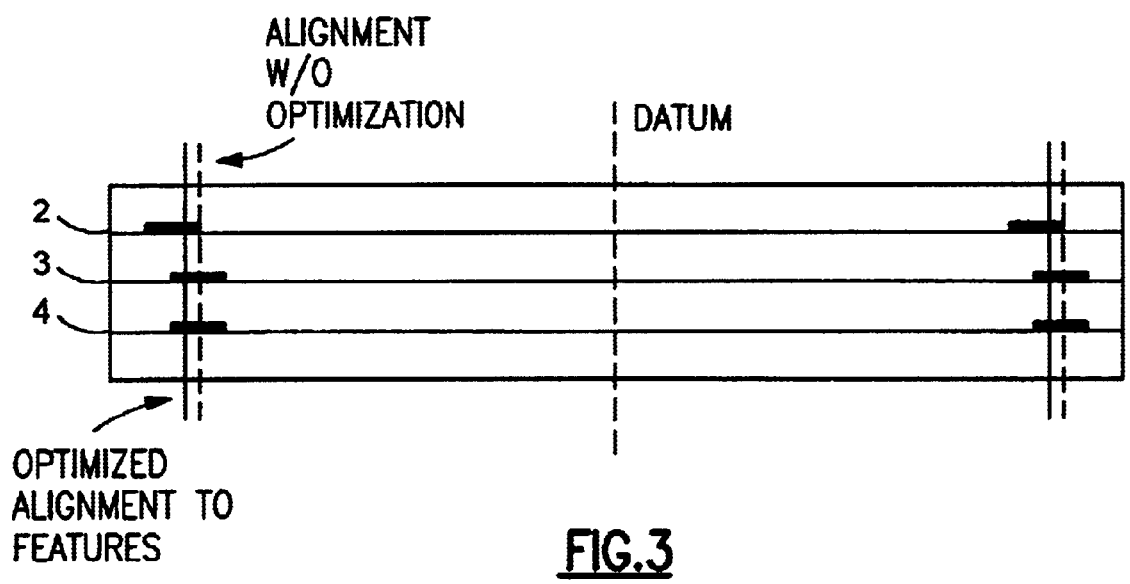
FIG. 3 represents a cross-sectional view of the multi-layer circuit board shown in FIG. 2 showing where features might be formed in the circuit board with and without reference to the alignment or misalignment of the layers of the circuit board.

According to the present invention, the location of the artwork features is determined visually. For example, a camera may be used to view the location of the artwork features relative to each other and to the reference points. This permits the present invention to determine alignment or misalignment without the use of X-rays. Also, this permits detection of alignment and misalignment from a lateral perspective as opposed to an overhead perspective. During visual inspection of the artwork features and reference points, deviations may be detected within and among the layers. FIGS. 2 and 3 show the misalignment of layers of the multi-layer structure.

Once the relative locations of the artwork features are determined, the optimal location for adding additional features to the multi-layer structure may be determined. FIG. 3 shows and embodiment of such an alignment optimization. Additional features that may be included in the multi-layer structure include holes that may be drilled in the multi-layer structure and external artwork.

Actually, all processing subsequent to the provision of the artwork feature(s) may utilize the alignment information generated in by the present invention. For example, drilling, external circuitization, protective coating, contact testing, and gold plating can utilize the data. Alignment or registration information may be provided to downstream processes to correct errors at their source, errors that are compensated for using the present invention, that is, lamination and circuitization registration optimization.

In FIGS. 2 and 3, layer 2 is translated with respect to layers 3 and 4. FIG. 3 shows the determination of the alignment of the location for forming a hole through the multi-layer structure relative to the location of the layers as determined by relative location of the artwork features determined during the process. The broken lines shown in FIG. 3 indicate a location of a through hole without considering the alignment, or, in this case, misalignment, of the layers.

Forming a hole in an incorrect location as a result of misalignment can result in, among other consequences, dielectric spacing violations, such as electrical shorts and electrical opens.

The present invention permits determination of translational offsets and/or compensation when subsequently processing the multi-layer structure. Examples of subsequent processing include drilling of holes and external circuitization. The holes may subsequently be plated to form plated through holes.

The present invention also includes a multi-layer circuit board. The circuit board preferably includes a plurality of layers of electrically insulating material(s). At least one artwork feature is located on a surface of at least one of the layers of electrically insulating material in the vicinity of at least one edge of the at least one layer of electrically insulating material. At least one reference point is located on the at least one layer of electrically insulating material on sides of the at least one layer corresponding to the at least one edge of the at least one layer that the at least one artwork feature is located on. The circuit board also includes at least one additional feature in and/or on the multi-layer circuit board. The at least one additional feature may include a plated through hole or external circuitization.

The at least one reference point may include at least one indentation formed in at least one edge of the at least one layer. In embodiments including a plurality of reference points, the reference points on the layers of electrically insulating material may be formed in substantially the same location on each layer of electrically insulating material that includes a reference point.

The at least one artwork feature is visible from the side of the multi-layer circuit board.

Artwork feature(s) and reference point(s) may or may not be included on each layer of electrically insulating material making up the multi-layer structure. However, the location of the artwork features is visually determinable, although application of, for example, ultraviolet light, may be necessary to visualize the feature(s).

At least one circuit feature may be formed in and/or on at least one layer of the multi-layer circuit board.

The artwork feature(s) may include a line of copper on a surface of the layers of electrically insulating material. The layers of electrically insulating material may include at least one artwork feature that is visible from at least one side of the multi-layer circuit board. The discussion above regarding arrangement, composition and other characteristics of the artwork feature(s) applies here as well.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for making a multilayer printed circuit board, said method comprising the steps of:
    forming a first layer of said board, said first layer comprising a first insulating layer;
    forming a second layer of said board, said second layer comprising a second insulating layer and a first alignment feature and first circuitization on a surface of said second insulating layer, said alignment feature visible laterally at an edge of said second layer;
    forming a third layer of said board, said third layer comprising a third insulating layer and a second alignment feature and second circuitization on a surface of said third insulating layer, said second alignment feature visible laterally at an edge of said third layer;
    laminating said first, second and third layers to each other such that said first insulating layer has an interior surface adjacent to said first alignment feature and said first circuitization and an opposite surface which is exposed, and said second alignment feature and said second circuitization are adjacent to a surface of said second insulating layer opposite said first alignment feature and said first circuitization;
    determining from said first and second alignment features if said second layer is properly aligned with said third layer after said laminating step; and
    if so, circuitizing said exposed surface of said first layer after said laminating step at a predetermined location on said first insulating layer in accordance with proper alignment of said second layer with said third layer, and
    if not, circuitizing said exposed surface of said first insulating layer after said laminating step offset from said predetermined location in accordance with misalignment of said second layer with said third layer, the circuitization of said first insulating layer being offset from said predetermined location to compensate for the misalignment.

2. A method as set forth in claim 1 wherein said determining step is performed using a camera.

3. A method as set forth in claim 1 wherein said first alignment feature comprises a metalized region on said second insulating layer, and said second alignment feature comprises a metalized region on said third insulating layer.

4. A method as set forth in claim 1 wherein each of said alignment features is an artwork feature.

5. A method as set forth in claim 4 wherein said determining step is performed using a reference cutout on said printed circuit board in addition to said alignment features.

6. A method as set forth in claim 1 wherein if said second layer is not properly aligned with said third layer, drilling a hole through said first, second and third layers to interconnect said first circuitization and said second circuitization, a location of said hole compensating for the improper alignment of said second layer with said third layer.

7. A method for making a multilayer printed circuit board, said method comprising the steps of:
    forming a first layer of said board, said first layer comprising a first insulating layer;
    forming a second layer of said board, said second layer comprising a second insulating layer and a first alignment feature and first circuitization on a surface of said second insulating layer, said alignment feature visible laterally at an edge of said second layer;
    forming a third layer of said board, said third layer comprising a third insulating layer and a second alignment feature and second circuitization on a surface of said third insulating layer, said second alignment feature visible laterally at an edge of said third layer;
    forming a fourth layer of said board, said fourth layer comprising a fourth insulating layer and a third alignment feature and third circuitization on a surface of said fourth insulating layer, said third alignment feature visible laterally at an edge of said fourth layer;
    laminating said first, second, third and fourth layers to each other such that said first insulating layer has an interior surface adjacent to said first alignment feature and said first circuitization and an opposite surface which is exposed, said second alignment feature and said second circuitization are adjacent to a surface of said second insulating layer opposite said first alignment feature and said first circuitization, and said third alignment feature and said third circuitization are adjacent to a surface of said third insulating layer opposite said second alignment feature and said second circuitization,
    determining from said first, second and third alignment features if said second, third and fourth layers are properly aligned with each other after said laminating step; and
    if so, circuitizing said exposed surface of said first insulating layer after said laminating step at a predetermined location on said first insulating layer in accordance with proper alignment of said second, third and fourth layers with each other, and
    if not, circuitizing said exposed surface of said first insulating layer after said laminating step offset from said predetermined location in accordance with misalignment of said second, third and fourth layers with each other, the circuitization of said first insulating layer being offset from said predetermined location to compensate for the misalignment.

* * * * *